(12) United States Patent
Ripley et al.

(10) Patent No.: US 7,622,189 B2
(45) Date of Patent: Nov. 24, 2009

(54) CERAMIC NANOSTRUCTURES AND METHODS OF FABRICATION

(75) Inventors: Edward B. Ripley, Knoxville, TN (US); Roland D. Seals, Oak Ridge, TN (US); Jonathan S. Morrell, Knoxville, TN (US)

(73) Assignee: Babcock & Wilcox Technical Services Y-12, LLC, Oak Ridge, TN (US)

( * ) Notice: Subject to any disclaimer, the term of this patent is extended or adjusted under 35 U.S.C. 154(b) by 570 days.

(21) Appl. No.: 11/472,080

(22) Filed: Jun. 21, 2006

(65) Prior Publication Data

US 2007/0297972 A1    Dec. 27, 2007

(51) Int. Cl.
| | |
|---|---|
| *B82B 1/00* | (2006.01) |
| *B82B 3/00* | (2006.01) |
| *C01B 33/00* | (2006.01) |
| *C01B 33/113* | (2006.01) |
| *C01B 33/12* | (2006.01) |
| *C01F 1/00* | (2006.01) |
| *C01F 7/00* | (2006.01) |
| *C01F 7/02* | (2006.01) |
| *C01F 7/04* | (2006.01) |
| *C01G 23/00* | (2006.01) |
| *C01G 23/04* | (2006.01) |
| *C01G 23/047* | (2006.01) |
| *C04B 35/00* | (2006.01) |
| *C04B 35/10* | (2006.01) |
| *C04B 35/14* | (2006.01) |
| *C04B 35/46* | (2006.01) |

(52) U.S. Cl. ............ 428/372; 428/357; 428/364; 428/401; 428/402; 423/324; 423/325; 423/327.1; 423/335; 423/592.1; 423/598; 423/600; 423/610; 501/126; 501/127; 501/133; 501/134; 501/153; 501/154; 977/734; 977/735; 977/754; 977/773; 977/774; 977/778; 977/779; 977/811; 977/813; 977/814; 977/815; 977/831

(58) Field of Classification Search .......... 977/734, 977/735, 754, 773, 774, 778, 779, 811, 813, 977/814, 815, 831; 423/324, 325, 327, 327.1, 423/335, 592.1, 598, 600, 610; 502/346, 502/350, 355; 501/126, 127, 133, 134, 153, 501/154; 428/357, 364, 372, 401, 402

See application file for complete search history.

(56) References Cited

U.S. PATENT DOCUMENTS 5,958,590 A    9/1999    Kang et al.

(Continued)

*Primary Examiner*—Timothy C Vanoy
*Assistant Examiner*—Serena L Hanor
(74) *Attorney, Agent, or Firm*—Michael J. Renner; Luedeka, Neely & Graham, P.C.

(57) ABSTRACT

Structures and methods for the fabrication of ceramic nanostructures. Structures include metal particles, preferably comprising copper, disposed on a ceramic substrate. The structures are heated, preferably in the presence of microwaves, to a temperature that softens the metal particles and preferably forms a pool of molten ceramic under the softened metal particle. A nano-generator is created wherein ceramic material diffuses through the molten particle and forms ceramic nanostructures on a polar site of the metal particle. The nanostructures may comprise silica, alumina, titania, or compounds or mixtures thereof.

19 Claims, 8 Drawing Sheets

U.S. PATENT DOCUMENTS

| | | |
|---|---|---|
| 5,968,449 A | 10/1999 | Aoki et al. |
| 6,239,547 B1 | 5/2001 | Uemura et al. |
| 6,618,941 B2 | 9/2003 | Campbell et al. |
| 7,422,790 B1 * | 9/2008 | Scher et al. .............. 428/411.1 |
| 2002/0192141 A1 | 12/2002 | Little |
| 2003/0042128 A1 | 3/2003 | Harutyunyan et al. |
| 2004/0197638 A1 | 10/2004 | McElrath et al. |
| 2006/0083674 A1 | 4/2006 | Maruyama et al. |
| 2006/0121371 A1 | 6/2006 | Wu |

\* cited by examiner

CERAMIC NANOSTRUCTURES AND METHODS OF FABRICATION

GOVERNMENT RIGHTS

The U.S. Government has rights to this invention pursuant to contract number DE-AC05-00OR22800 between the U.S. Department of Energy and BWXT Y-12, L.L.C.

FIELD

This invention relates to the field of microstructures and nanostructures. More particularly, this invention relates to silica and alumina and similar ceramic materials that form nanostructures typically having dendritic curtain-like morphologies.

BACKGROUND

The science of nano-technology is an emerging field with a host of novel and unique applications. Nanostructured materials are characterized by an ultra-fine microstructure having some physical feature less than 100 nanometers in size. This feature may be grain size, the diameter of a constituent particle or fiber, or a layer thickness. Following the initial discovery of the existence of the carbon nanotube, carbon, silicon-based, and other nanostructures have been an area of significant interest because of their unusual electrical and mechanical properties. Carbon nanotubes and silicon-based nanostructures offer promises for super strong materials and extremely small, fast computer chips, while doped silica nanofibers may offer new approaches for interconnects, transistors, luminescent devices, photo-detectors and chemical sensors. However, major challenges have heretofore been unresolved, particularly with respect to developing efficient systems for (and methods of) production of ceramic nanostructured materials. Applications of silica, alumina and titania nanostructures may be enhanced by utilization of various alternative physical structures of these materials if various alternative physical structures could be produced efficiently. What are needed therefore are alternative morphologies and methods of fabrication of silica, alumina, and titania nanostructures, and other ceramic nanostructures.

SUMMARY

The present invention provides a plurality of generally columnar nanoparticles as well as a nanostructure derived from an interface between a softened metal catalyst particle and a nano-ceramic substrate. Further provided is a process for fabricating a nanostructure and a nanostructure produced by that process. One embodiment includes a plurality of generally columnar nanoparticles, where each generally columnar nanoparticle has a longitudinal section and each longitudinal section of each generally columnar nanoparticle is interconnected to the longitudinal section of at least one other of the plurality of generally columnar nanoparticles. Furthermore, each columnar nanoparticle has an end and the ends of the columnar nanoparticles are interconnected in a substantially dendritic pattern. Another embodiment provides a nanostructure that is derived from an interface between a softened metal catalyst particle and a nano-ceramic substrate, where the nanostructure includes a plurality of generally columnar nanoparticles.

According to a step of a process for fabricating a nanostructure, a metal catalyst particle is disposed on a substrate that includes a nano-ceramic material that dissolves in the metal catalyst particle at a temperature not exceeding the boiling temperature of the of the metal catalyst particle. A substrate interface is formed where the metal catalyst particle rests on the substrate. In another step, the metal catalyst particle and the substrate are heated to a temperature between (1) a temperature at which at least a portion of the nano-ceramic material dissolves into the metal catalyst particle at the substrate interface and (2) the boiling point of the metal catalyst particle. In another step, at least a portion of the nano-ceramic material is pumped from the substrate into the metal catalyst particle until a nanostructure including the nano-ceramic material forms on a polar site of the metal catalyst particle, the polar site being substantially opposed to the substrate interface. The metal catalyst particle containing the pumped nano-ceramic material and the nanostructure are cooled to ambient temperature. A further embodiment described herein provides a product made by this process.

BRIEF DESCRIPTION OF THE DRAWINGS

Further advantages may be apparent by reference to the detailed description in conjunction with the figures, wherein elements are not to scale so as to more clearly show the details, wherein like reference numbers indicate like elements throughout the several views, and wherein.

DETAILED DESCRIPTION

Nanostructured materials (also synonymously referred to herein as "nanostructures") are materials made of a plurality of nanoparticles. Nanoparticles are very small structures having at least one physical dimension that is smaller than 100 nanometers. The present invention provides nanostructured materials including "nano-ceramics" and methods for production of nanostructured materials including "nano-ceramics." As used herein, "nano-ceramics" include silica, alumina, and titania, and compounds of silica, and compounds of alumina, and compounds of titania, and mixtures that include silica or alumina or titania and combinations thereof, and mixtures that include compounds of silica or alumina or titania and combinations thereof. Examples of compounds of silica, alumina, or titania (using alumina as the representative species) are alkali compounds such as lithium aluminate, alkaline earth compounds such as calcium aluminate and magnesium aluminate ($MgAl_2O_4$ or "spinel"), and first and second transition row metal compounds such as nickel aluminate and yttrium aluminate. "Nano-ceramics" also include any metal oxide that dissolves in one or more metals selected from scandium, titanium, vanadium, chromium, manganese, iron, cobalt, nickel and copper.

Materials and techniques are described for the production of nanostructured materials from softened or molten metal catalyst particles produced on a nano-ceramic substrate that dissolves into the metal catalyst particle and thereby provides the feed material for creation of nanostructures. Molten metal catalyst particles are a subset of softened metal catalyst particles. The composition of the most preferred metal catalyst particles is substantially copper because most metal oxides dissolve in copper. However, most other first row transition metals (i.e., scandium, titanium, vanadium, chromium, manganese, iron, cobalt, and nickel) may also be used as metal catalyst particles. Zinc is generally not useful because metal oxides typically will not dissolve in it. These nanostructured materials that are produced on a nano-ceramic substrate that dissolves into the metal catalyst particle are formed as a dense mass in patterns often replicating a dendritic structure formed on a softened or molten metal catalyst particle.

Examples of nanostructured materials are provided in the descriptions and figures given herein. Preferably a 2.45 GHz multi-mode microwave furnace is used to heat a ceramic substrate (or other source of nano-ceramic feed material) and metal catalyst particles in an inert atmosphere in order to fabricate silica/alumina nanostructures. A nano-ceramic substrate preferably is formed as a sheet including nano-ceramic material but the ceramic substrate may also be a ceramic particle which is in contact with the metal catalyst particle. Other methods of heating may be used, but the processes may be enhanced by heating in the presence of microwaves.

Figure 1A:
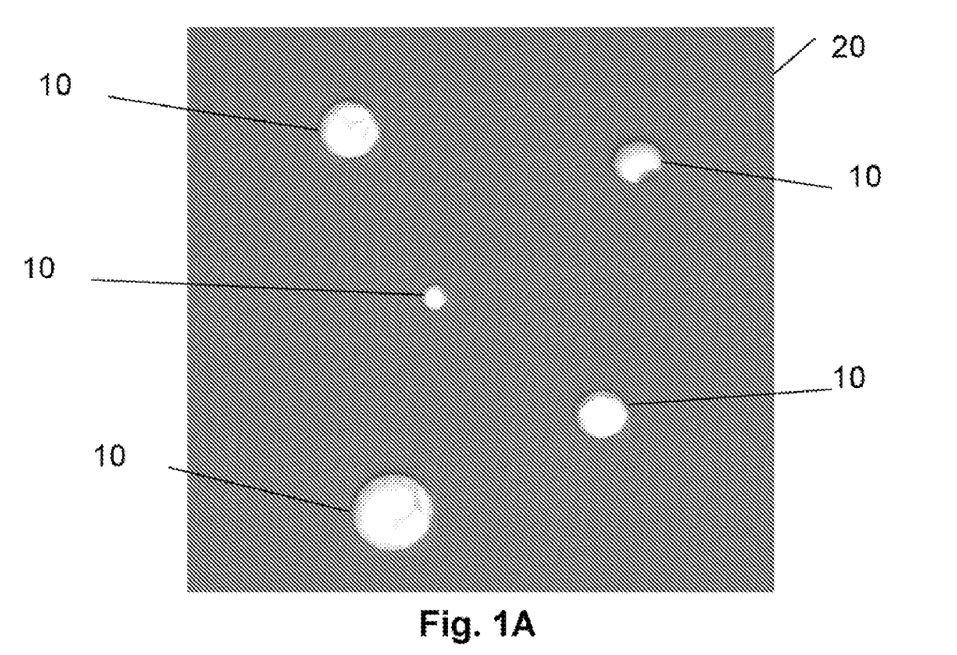
FIGS. 1A, 1B, and 1D are photomicrographs showing the formation of silica/alumina nanostructures on metal catalyst particles.
Figure 1B:
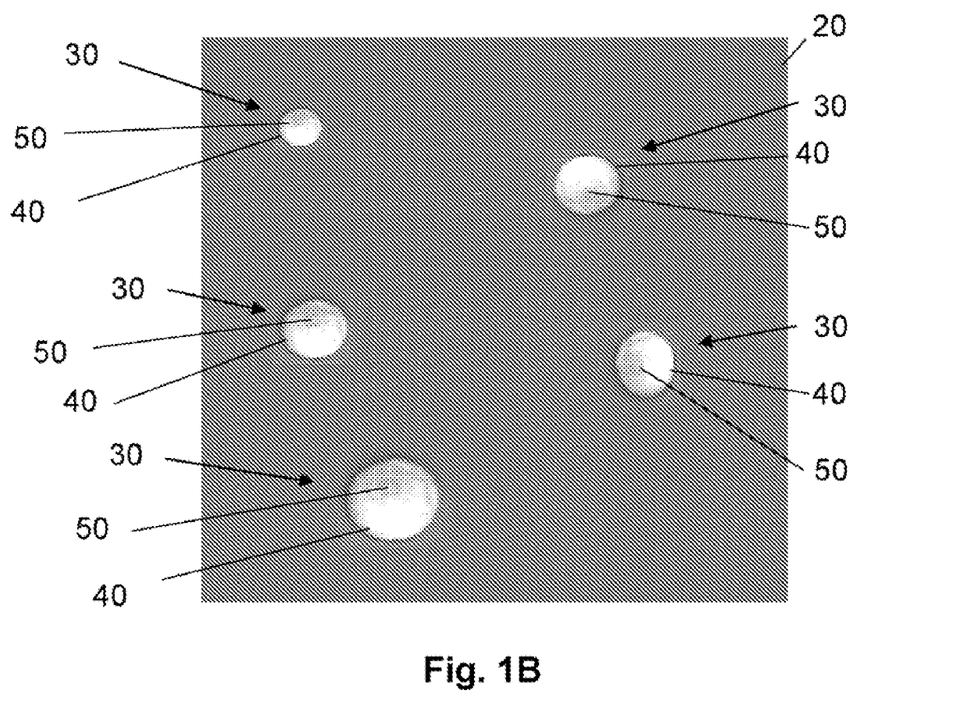
Figure 1C:
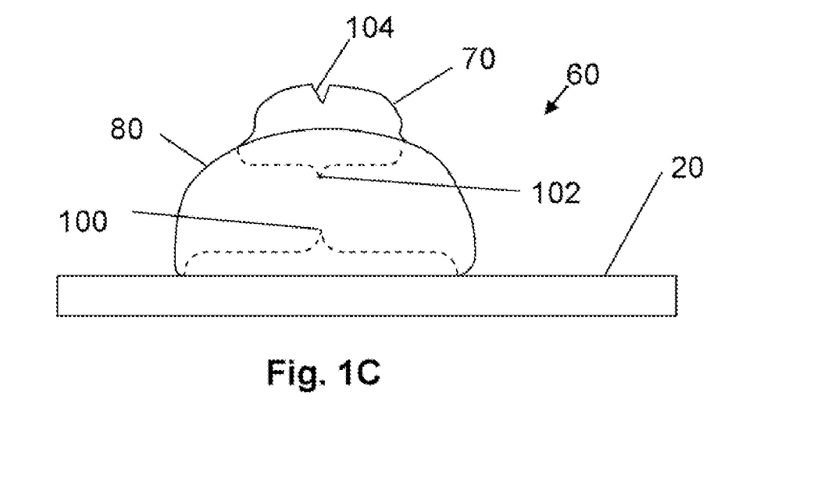
FIG. 1C is a side view schematic representation of a nano-generator that produces nanostructures.

FIGS. 1A, 1B, and 1C illustrate the growth of nanostructured silica/alumina materials. In FIG. 1A, metal catalyst particles 10 are shown disposed on a silica-alumina ($SiO_2$—$Al_2O_3$) substrate 20. In the embodiment of FIGS. 1A, 1B, and 1C, the composition of the metal catalyst particles 10 is substantially copper. The preferred size of metal catalyst particles ranges from approximately one quarter micron to two hundred fifty microns. Substrate 20 most preferably includes between ten and thirty percent $SiO_2$ (silica) with (again, most preferably) the balance being $Al_2O_3$ (alumina). Note that silica preferably forms a smaller percentage of the composition of the substrate than alumina. For some embodiments substantially pure alumina may be used. In some embodiments silica may constitute the larger percentage of the silica-alumina substrate, and in some embodiments pure silica may be used as the substrate.

In FIG. 1B nascent nano-generators 30 are depicted. Nascent nano-generators 30 include metal catalyst particles 40 on the silica-alumina substrate 20. An initial growth of silica/alumina nanostructures 50 forms at a pole site on the softened or melted metal catalyst particles 40. The silica-alumina substrate 20 provides the feed materials for the silica/alumina nanostructures 50 that are formed on the surface of the small metal catalyst particles 40, each of which in this embodiment floats on a molten ceramic pool of substrate 20 as the nanostructures 50 are formed. The composition of the metal catalyst particles 40 is substantially copper in this embodiment. The composition of the silica/alumina nanostructures 50 is substantially silica and alumina in approximately the same proportions as substrate 20.

FIG. 1C presents a side view schematic illustration of a mature nano-generator 60. Metal catalyst particle 80 is positioned on silica-alumina substrate 20 such that a substrate interface 100 is established between metal catalyst particle 80 and silica-alumina substrate 20. A mature formation of nanostructure 70 has formed on metal catalyst particle 80 at a polar site 102 that is approximately diametrically opposed across the metal catalyst particle 80 from the substrate interface 100 between the metal catalyst particle 80 and the substrate 20. A radial fracture face 104 has formed in the mature formation of nanostructure 70.

Figure 1D:
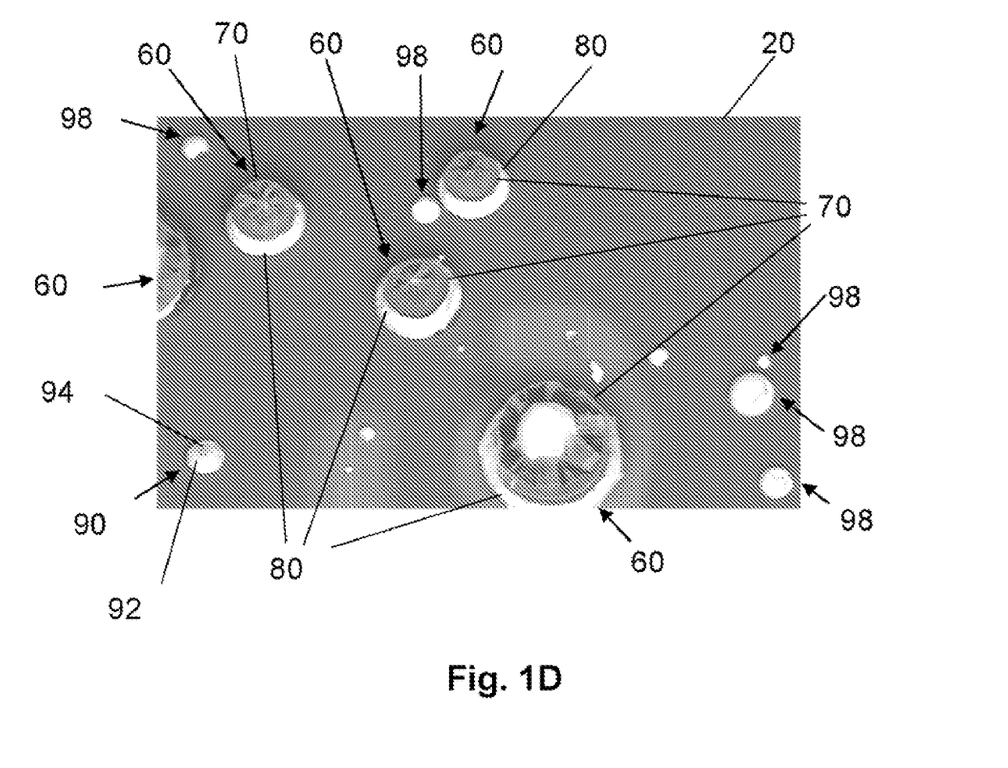

As previously indicated in describing FIG. 1B, an initial growth of nanostructures 50 forms at a pole site on the softened or melted metal catalyst particles 40. The growth of nanostructured materials at the polar site continues as feed material moves through the metal catalyst material and, as shown in FIG. 1D, mature nano-generators 60 take form on silica-alumina substrate 20. Note that mature formations of nanostructures 70 are formed on metal catalyst particles 80, and an initial growth of silica nanostructured material 94 is formed on metal catalyst particle 92 of nascent nano-generator 90. Also shown in FIG. 1D are metal catalyst particles 98 that have not developed any significant nanostructures.

The formation of nanostructures 50, 70 and 94 on the surface of metal catalyst particles 40, 80 and 92 (respectively) as variously depicted in FIGS. 1B, 1C, and 1D is the result of diffusion of ceramic material (e.g., silica and/or alumina), that is most preferably molten, from a substrate (e.g., silica-alumina substrate 20 in FIG. 1C) across the substrate interface (e.g., 100 in FIG. 1C) between the metal catalyst particle (e.g., 80) and the substrate (e.g., 20) into a metal catalyst particle (e.g., 80). Nanostructures 50, 70 and 94 are examples of nanostructures derived from an interface between a softened metal and a nano-ceramic substrate, and (as will be described in more detail later herein) the nanostructures typically comprise generally columnar nanoparticles. The growth of nanostructured materials continues from the interface with the substrate through the columnar and surface features of the catalyst material (i.e., the metal catalyst particle). The process is materially enhanced when the nano-ceramic material is significantly soluble in the metal catalyst particle at a temperature that is between the melting temperature and the boiling point of the metal catalyst particle. Note that while the nanostructures 50, 70, and 94 of FIGS. 1B, 1C and 1D were formed from molten nano-ceramic material, significant solubility of nano-ceramic material into a metal catalyst particle may occur (and nanostructures may be formed) at temperatures below the melting temperature of the nano-ceramic material.

Table 1 illustrates thermal properties of some nano-ceramic materials that are suitable for use as substrates, and Table 2 illustrates properties of certain transition metals that are suitable for use as metal catalyst particles.

TABLE 1

| Substance | Melting temp. $T_f$ K | Boiling temp. $T_b$ K |
|---|---|---|
| Alumina | 2300 | Not Applic. |
| Silica | 1996 | Not Applic. |
| Titania | 2,143 | Not Applic. |

TABLE 2

| Substance | Melting temp. $T_f$ K | Boiling temp. $T_b$ K |
|---|---|---|
| Scandium | 1814 | 3103 |
| Titanium | 1941 | 3560 |
| Vanadium | 2183 | 3680 |
| Chromium | 2180 | 2944 |
| Manganese | 1519 | 2334 |
| Iron | 1811 | 3134 |
| Cobalt | 1768 | 3200 |

TABLE 2-continued

| Substance | Melting temp. $T_f K$ | Boiling temp. $T_b K$ |
|---|---|---|
| Nickel | 1730 | 3200 |
| Copper | 1358 | 2830 |

As seen in Table 1, alumina and silica have melting temperatures of 2300K and 1996K respectively, each of which is higher than the melting temperature of copper (1358K) and lower than the boiling point (2830K) of copper. Alumina and silica begin to diffuse into copper at a significant rate at a temperature (~542° C.) that is around one half the melting temperature (1085° C.) of copper. In general, when the substrate and the metal catalyst particles are heated to a temperature above about one half the melting temperature (measured in Celsius) of the metal catalyst particles, quantities of the silica-alumina substrate diffuse into the metal at a significant rate, even though the silica-alumina substrate is not molten.

Referring again to FIG. 1C, the formation of nano-ceramic nanostructures 70 is enhanced by creating a "pumping force" across the metal catalyst particle 80 from the substrate interface 100 to the polar site 102. Note that the polar site 102 is substantially opposed to the substrate interface, across the metal catalyst particle 80. This pumping force that pumps nano-ceramic material from the substrate 20 into and through the metal catalyst particle 80 may be a thermal gradient (temperature drop), a diffusion concentration gradient, an electrostatic force, or some other driving force to move diffused ceramic (silica or alumina) from the substrate interface 100 to the polar site 102. A diffusion concentration gradient is formed virtually automatically as portions of the nano-ceramic in substrate 20 mix with the metal catalyst particle 80 at the metal-ceramic substrate interface 100. A thermal gradient across the metal catalyst particle 80 may be established by maintaining the temperature of the substrate 20 at a temperature higher than the temperature of the atmosphere surrounding the metal catalyst particle 80. The first nanostructure material to form sets up a dendritic structure on the surface of the softened or molten metal catalyst particle 80 at its polar site 102 from which the nanoparticles grow as a result of the addition of cooler solidifying material to the nanostructure 70 at the interface between the nanostructure 70 and the softened or molten metal particle 80 at the polar site 102 of the metal catalyst particle 80. Heating the substrate 20 and the metal catalyst particle 80 in the presence of microwave energy assists in establishing an electrostatic pump across the metal catalyst particle 80.

Preferably ceramic nano-generators (e.g., 60 in FIGS. 1C and 1D) are produced using a 12 kW 2.45 GHz multi-mode microwave furnace. The substrate (e.g., 20 in FIGS. 1A-1D) and the metal catalyst particles (e.g., 80 in FIGS. 1C and 1D) are preferably heated in a dielectrically lossy ceramic crucible that absorbs a substantial portion of the microwave energy. Preferably the crucible is placed in a ceramic casket that is substantially transparent to microwaves and is thermally insulative to prevent loss of heat from the crucible. The atmosphere is most preferably made inert, preferably by using an argon purge and backfill. The materials in the crucible are heated at 12 Kw until the temperature of the substrate reaches approximately 1473 (Kelvin) and the mature nanostructure (e.g., 70 in FIGS. 1C and 1D) is formed. The substrate and metal catalyst particles are then cooled to ambient temperature for removal of the nanostructure.

Figure 2A:
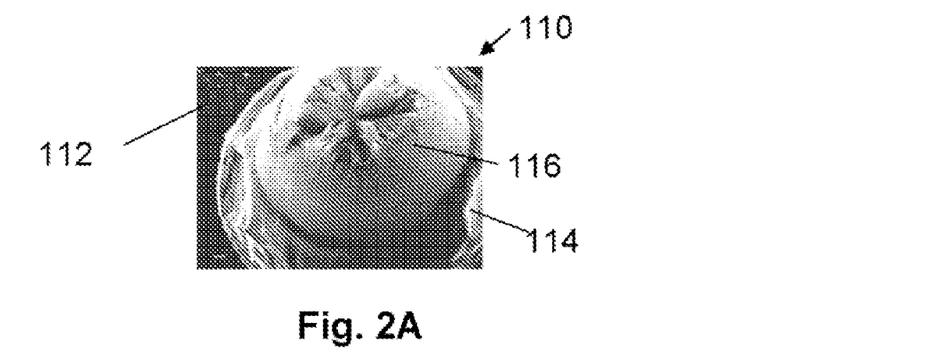
FIGS. 2A-2D are photomicrographs of a morphology of silica/alumina nanostructures grown on a metal catalyst particle.
Figure 2B:
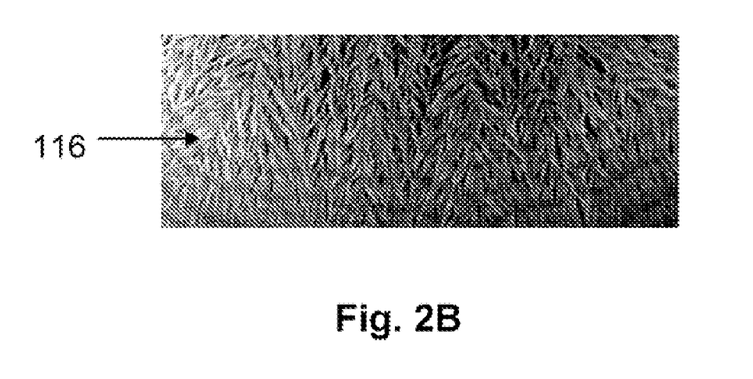
Figure 2C:
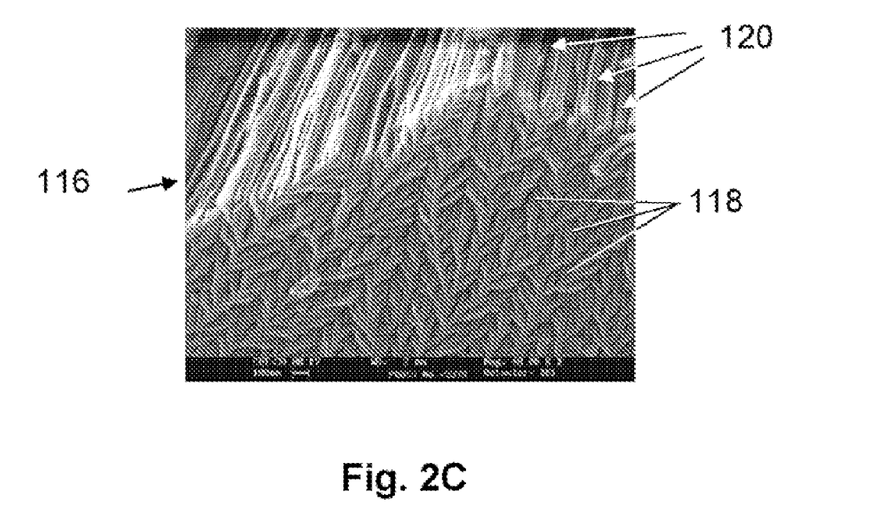

FIG. 2A depicts a mature nano-generator 110 including a copper particle 114 on a silica-alumina substrate 112. Nano-generator 110 has a mature formation of a dendritic curtain-like nanostructure 116 formed on the copper particle 114. Copper particle 114 is an example of a metal catalyst particle. FIG. 2B is a magnified image of the surface of dendritic curtain-like nanostructure 116. FIG. 2C shows a perspective view of the ends 118 of columnar nanoparticles 120 of dendritic curtain-like nanostructure 116, illustrating how the nanostructure 116 is formed as a high-density bundle of nandparticles 120 replicating, in this instance, a dendritic pattern formed on the copper particle 114 upon which the dendritic curtain-like nanostructure 116 was formed. Columnar nanoparticles 120 are examples of generally columnar nanoparticles that have formed on a metal catalyst particle.

Figure 2D:
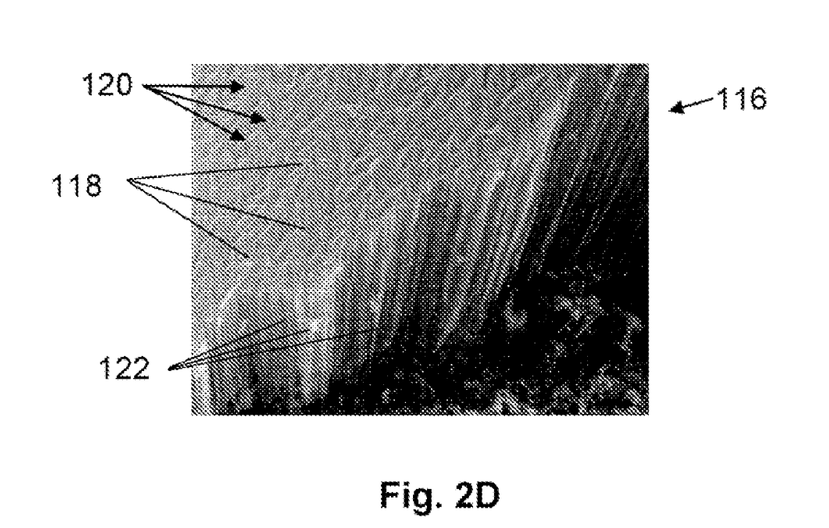
Figure 2E:
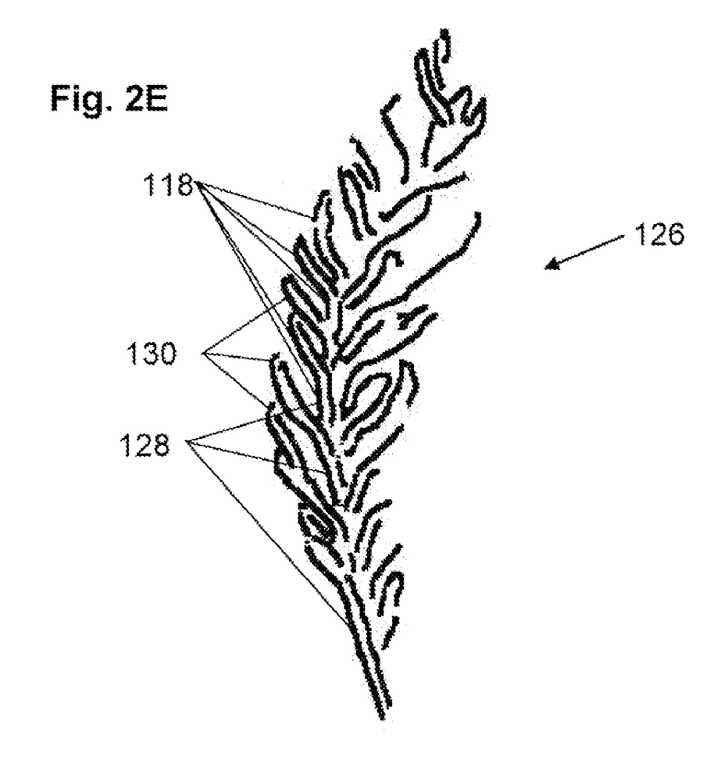
FIG. 2E provides an illustration of the typical dendritic nature of dendritic curtain-like nanostructures.
Figure 2F:
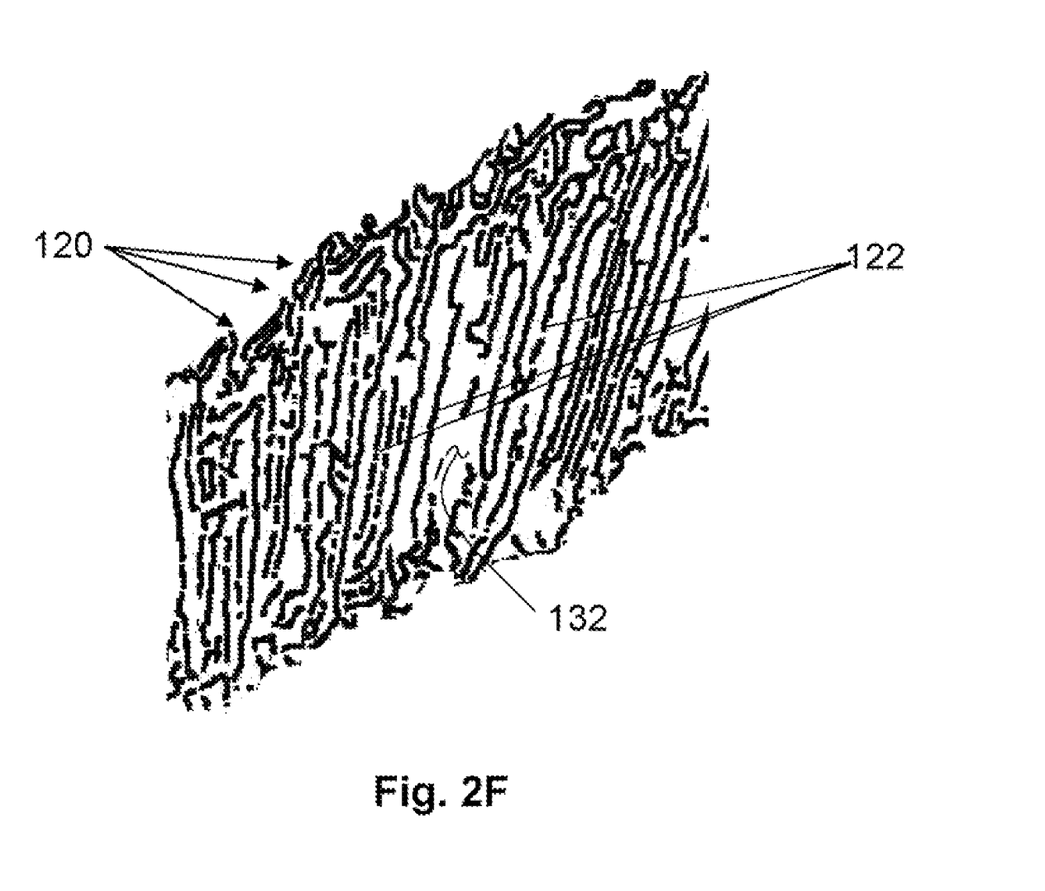
FIG. 2F provides an illustration of the typical curtain-like nature of dendritic curtain-like nanostructures.

FIG. 2D shows a micrographic image of the longitudinal segments 122 of columnar nanoparticles 120 that form the dendritic curtain-like nanostructure 116. FIG. 2E illustrates a pattern that is indicative of the "dendritic" nature of "dendritic curtain-like" nanostructures. Namely, the ends 118 (also shown on FIGS. 2C and 2D) of the columnar nanoparticles 120 are interconnected in a dendritic pattern 126 that has stem structures 128 and leaf structures 130. FIG. 2F illustrates a pattern that is indicative of the "curtain-like" nature of "dendritic curtain-like" nanostructures, namely that the surfaces shown in FIGS. 2C and 2D include columnar nanoparticles 120 with longitudinal segments 122 that are interconnected to form a curtain-like surface 132.

Figures 3A, 3B:
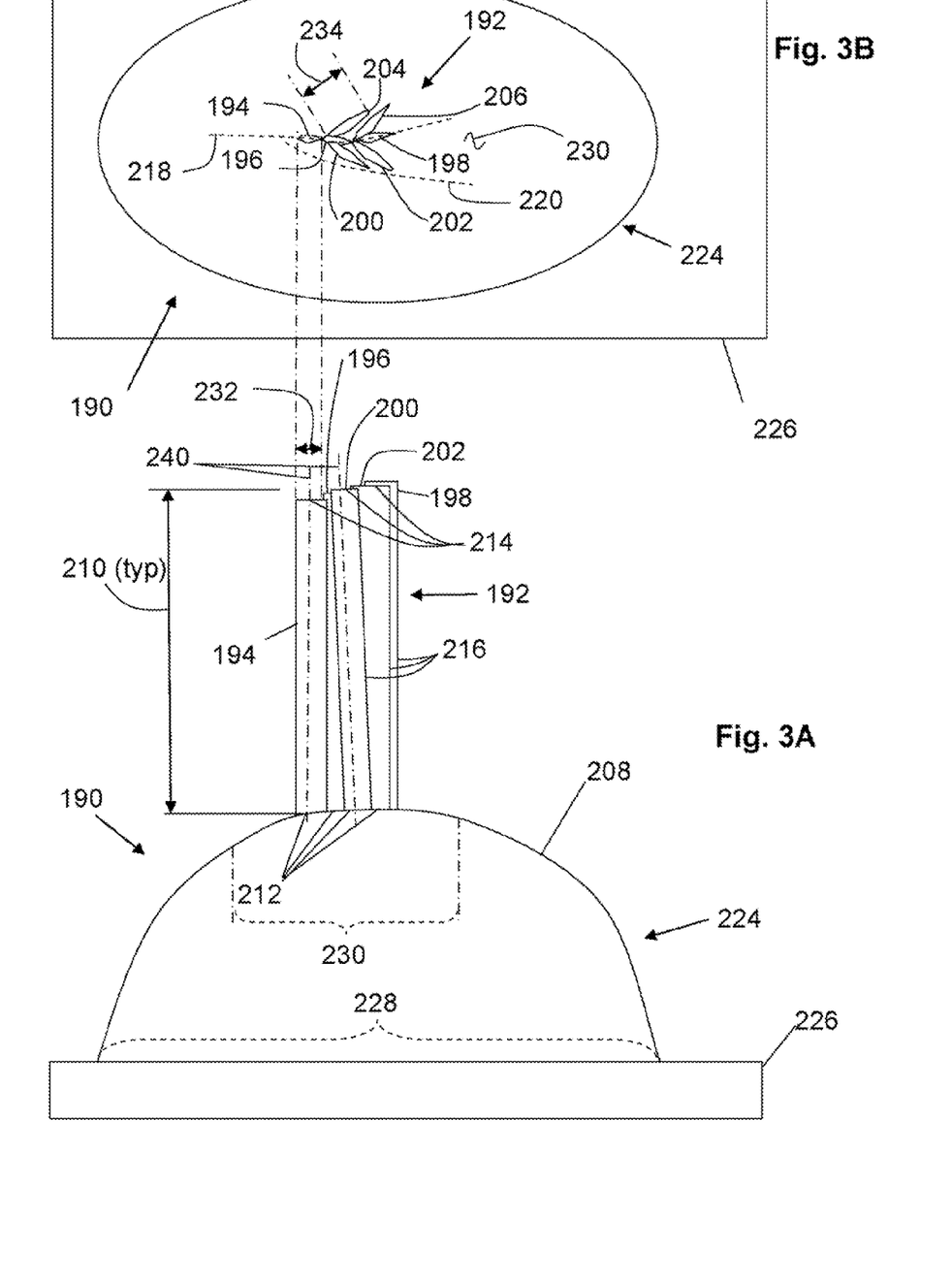
FIG. 3A is a side view schematic representation of a nano-generator that produces nanostructures.
FIG. 3B is a top view of the schematic of FIG. 3A.

FIGS. 3A and 3B illustrate the structure of a nano-generator 190 that has produced a dendritic curtain-like nanostructure 192. The dendritic curtain-like nanostructure 192 has columnar nanoparticles 194, 196, 198, 200, 202, 204 and 206 disposed on a metal catalyst particle 208. Typically a dendritic curtain-like nanostructure includes hundreds, thousands, or even millions of columnar nanoparticles, but for simplicity only seven columnar nanoparticles are shown for nanostructure 192. Columnar nanoparticles 194, 196, 198, 200, 202, 204 and 206 are examples of generally columnar nanoparticles that have formed on a metal catalyst particle (e.g., metal catalyst particle 208). Each columnar nanoparticle (e.g., 194, 196, 198, 200, 202, 204 and 206) has a length 210 that typically ranges up to several microns or longer, depending on process conditions and feed material. A length 210 of several millimeters is possible. The length 210 in FIG. 3A is labeled "typ" (i.e., typical) to indicate that the actual length of any specific columnar nanoparticle may vary within the range indicated. Columnar nanoparticles 194, 196, 198, 200, 202, 204 and 206 have tips 212 and have ends 214 that are distal from the tips 212. Columnar nanoparticles 194, 196, 198, 200, 202, 204 and 206 have longitudinal segments 216 extending between the tips 212 and the ends 214.

Each columnar nanoparticle (e.g., 194) also has a longitudinal axis 240 that passes through the centroid of the cross-section of the columnar nanoparticle at each point along the length (e.g., 210) of the columnar nanoparticle. In most embodiments the longitudinal axes 240 of the columnar particles (e.g., 194, 200) are substantially parallel. However, because dendritic curtain-like nanostructures are typically somewhat hemispherical in shape, and because the longitudinal segments (e.g. 216) that partially form the nanostructures (e.g., 192) are typically not uniform, straight and aligned, portions of the longitudinal axes (e.g., 240) of the columnar nanoparticles (e.g., 194, 200) may be misaligned, typically by a few degrees between nearby columnar bodies and sometimes by as much as ±thirty degrees or so between distant columnar bodies. However, even with ±thirty degrees variations in alignment, the longitudinal axes (e.g., 240) are still considered to be substantially parallel.

Continuing with FIG. 3A, for fabrication of the dendritic curtain-like nanostructure 192, metal catalyst particle 208 is disposed on a nano-ceramic substrate 226 such that a substrate interface 228 is provided between metal catalyst particle 208 and nano-ceramic substrate 226. The dendritic curtain-like nanostructure 192 forms on metal catalyst particle 208 at a polar site 230 of metal catalyst particle 208 that is substantially diametrically opposed to the substrate interface 228 of metal catalyst particle 208.

Dendritic curtain-like nanostructure 192 in FIG. 3A is characterized as "dendritic" because (like dendritic pattern 126 in FIG. 2E) dendritic curtain-like nanostructure 192 comprises (1) a series of columnar nanoparticles 194, 196, and 198, the ends 214 of which form a "stem" structure along curvilinear path 194, and (2) a series of columnar nanoparticles 200, 202, 204 and 206 that form "leaf" structures branching from the stem structure. Note that although columnar nanoparticles 194, 196 and 198 are substantially aligned along a curvilinear path 218, in some instances some of the columnar nanoparticles forming the stem structure (e.g., columnar nanoparticles 194, 196 and 198) may not be physically interconnected as a continuous chain, and gaps in the stem structure may be filled with portions of leaf structures (e.g., columnar nanoparticles 200, 202, 204 and 206).

Referring again to FIG. 3B, a plane 220 is defined. Plane 220 is substantially parallel to the longitudinal axes 240 of the generally columnar nanoparticles (e.g., columnar nanoparticles 194, 200, 202) that form a portion of the nanostructure (e.g., nanostructure 192). Dendritic curtain-like nanostructure 192 is characterized as "curtain-like" because, when the dendritic curtain-like nanostructure 192 is fractured radially (e.g., fractured in plane 220, the longitudinal segments 216 of columnar nanoparticles 194, 196, 198, 200, 202, (plus 204 and 206 which are not visible in FIG. 3A) form a curtain-like surface. "Curtain-like" refers to a surface that is substantially planar but includes a plurality of folds or pleats as found in household drapery or theater curtains.

Continuing with FIGS. 3A and 3B, each columnar nanoparticle (e.g., 194, 196, 198, 200, 202, 204 and 206) has a major diameter (e.g., major diameters 232 and 234) that typically ranges between thirty and one hundred and fifty nanometers, and is preferably between approximately seventy and ninety nanometers. Note that the term "major diameter" refers to the length of the major axis of the end 214 of the columnar nanoparticle (e.g., columnar nanoparticle 194). In many instances the major diameter (e.g., major diameter 232) of a columnar nanoparticle (e.g., columnar nanoparticle 194) forming a stem structure is less than the major diameter (e.g., major diameter 234) of a columnar nanoparticle (e.g., columnar nanoparticle 204) forming a leaf structure.

Figure 3C:
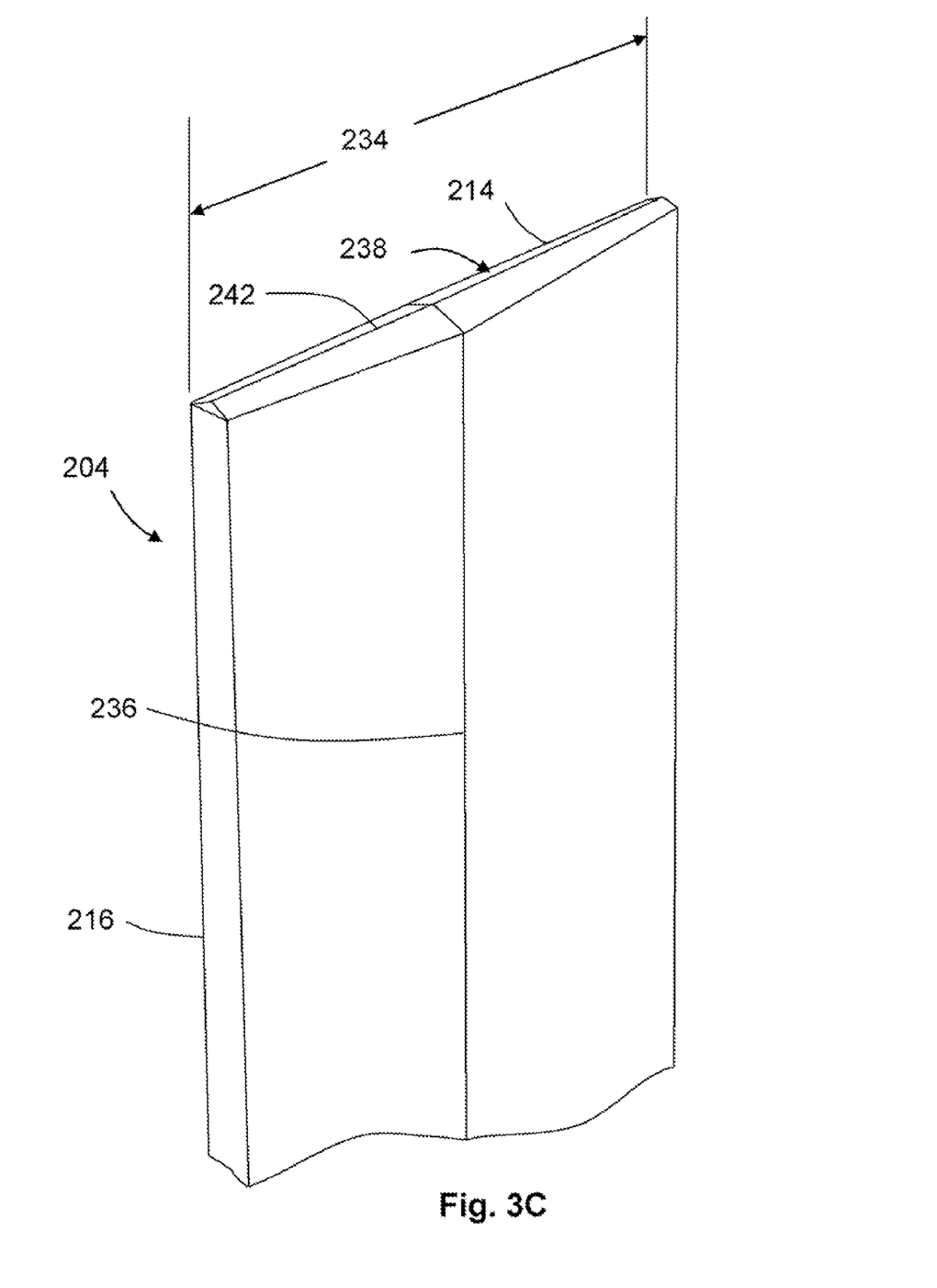
FIG. 3C is a perspective view of a columnar nanoparticle.

FIG. 3C depicts a perspective schematic illustration of columnar nanoparticle 204. The longitudinal segment (e.g., 216) of a columnar nanoparticle (e.g. 204) may have one or more ridges (e.g., 236) indicative of a crystalline-like structure. A further indication of a crystalline-like structure is a tapered ridged cap 238 on the end 214 of columnar nanoparticle 204. A tapered ridged cap is "roof-shaped" (as shown in FIG. 3C) meaning that a peak line 242 is established substantially parallel to the major axis 234 of the columnar nanoparticle 204. For simplicity of illustration, ridges (e.g., 236) and tapered ridged caps (e.g., 238) are not depicted in FIGS. 3A and 3B.

The dendritic curtain-like nanostructures of the types depicted in FIGS. 1C, 1D, 2A-2F, and 3A and 3B have many varied applications. For example, these nanostructures may be used as an electrostatic media for filters, or as an electrostatic fixture or manipulator to pick up and manipulate micro components in a MEMS device. These nanostructures may also act as an electrostatic generator, or as an electrostatic chuck to hold wafers for the semiconductor industry. These dendritic curtain-like nanostructures may also be used for making connections from nano components to ordinary-size circuits, a valuable step toward making the integrated memory and logic needed to make a functional nano-computer.

Figure 4:
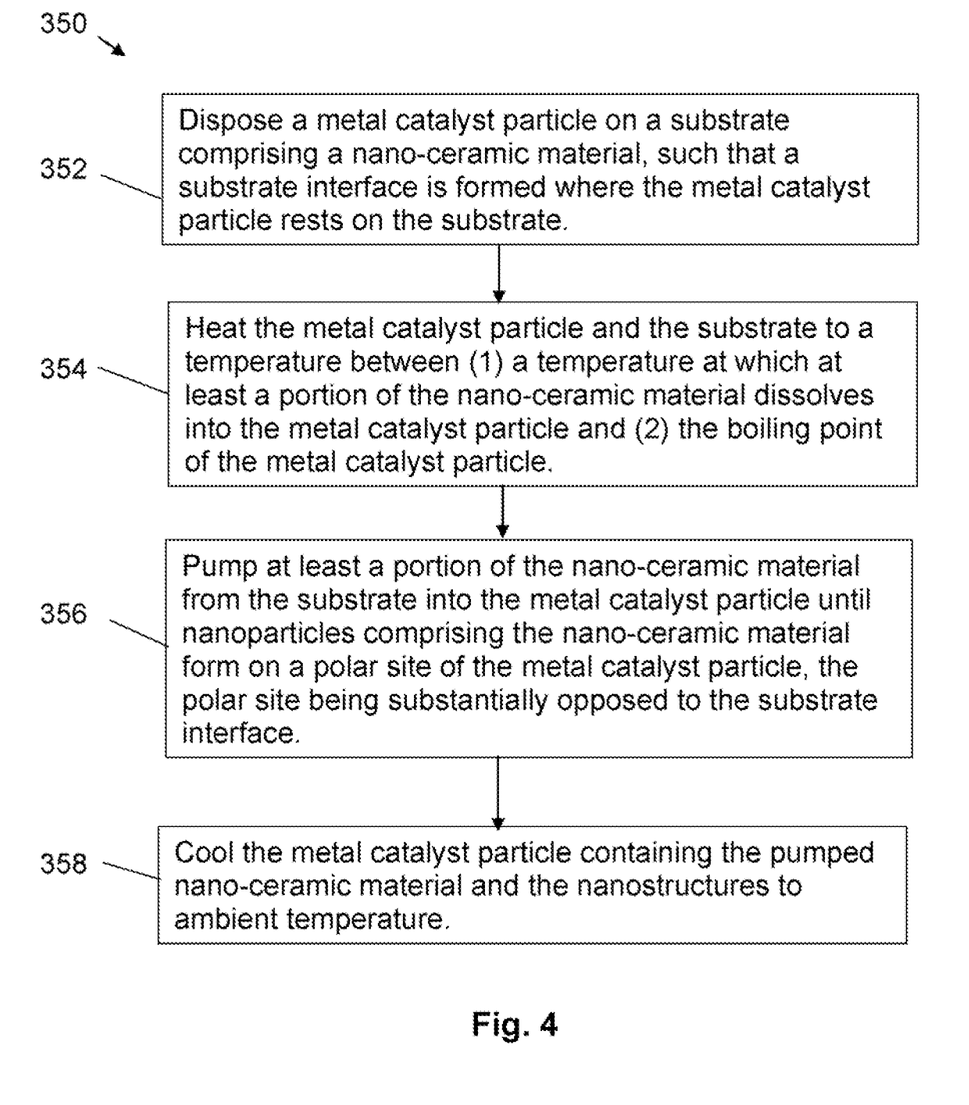
FIG. 4 is a flow chart of a method for forming nano-ceramic nanostructures.

FIG. 4 presents a flow chart 350 of a process for fabrication of nanostructures. The process begins in step 352 by disposing a metal catalyst particle on a substrate comprising a nano-ceramic material, such that a substrate interface is formed where the metal catalyst particle rests on the substrate. The substrate includes a material that dissolves in the metal catalyst particle at a temperature less than the boiling temperature of the metal catalyst particle. In step 354 the metal catalyst particle and the substrate are heated to a temperature between (1) a temperature at which at least a portion of the nano-ceramic material dissolves into the metal catalyst particle at the substrate interface and (2) the boiling point of the metal catalyst particle. In step 356, at least a portion of the nano-ceramic material is pumped from the substrate into the metal catalyst particle at the substrate interface until nanostructures made with the nano-ceramic material form on a polar site of the metal catalyst particle. The polar site is substantially opposed to the substrate interface (i.e., the polar site is substantially on the opposite side of the metal catalyst particle from the substrate interface). Finally, in step 358, the metal catalyst particle containing the pumped nano-ceramic material and the nanostructures is cooled to ambient temperature.

The foregoing descriptions of embodiments of this invention have been presented for purposes of illustration and exposition. They are not intended to be exhaustive or to limit the invention to the precise forms disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A plurality of generally columnar nanoparticles, each generally columnar nanoparticle and having a longitudinal section and each longitudinal section of each generally columnar nanoparticle being interconnected to the longitudinal section of at least one other of the plurality of generally columnar nanoparticles and each columnar nanoparticle having an end with a tapered ridged cap and the ends of the columnar nanoparticles being interconnected in a substantially dendritic pattern.

2. The plurality of generally columnar nanoparticles of claim 1 wherein the generally columnar nanoparticles have a major diameter of between approximately thirty and one hundred fifty nanometers.

3. The plurality of generally columnar nanoparticles of claim 1 wherein the generally columnar nanoparticles have a major diameter between approximately seventy and ninety nanometers.

4. The plurality of generally columnar nanoparticles of claim 1 wherein the plurality of generally columnar nanoparticles comprise silica.

5. The plurality of generally columnar nanoparticles of claim 1 wherein the plurality of generally columnar nanoparticles comprise alumina.

6. The plurality of generally columnar nanoparticles of claim 1 wherein the plurality of generally columnar nanoparticles comprise titania.

7. A nanostructure derived from an interface between a softened metal catalyst particle and a nano-ceramic substrate, the nanostructure comprising a plurality of generally columnar nanoparticles wherein the generally columnar nanoparticles each have a longitudinal axis and the longitudinal axes of the generally columnar nanoparticles are substantially parallel and the nanostructure has a curtain-like pattern on a radial fracture face.

8. The nanostructure of claim 7 wherein the generally columnar nanoparticles each have an end and the ends of the generally columnar nanoparticles are interconnected in a substantially dendritic pattern.

9. A process for fabricating a nanostructure, the process comprising the steps:
   (a) disposing a metal catalyst particle having a boiling point on a substrate comprising a nano-ceramic material that dissolves in the metal catalyst particle at a temperature less than the boiling point of the metal catalyst particle, wherein a substrate interface is formed where the metal catalyst particle rests on the substrate;
   (b) heating the metal catalyst particle and the substrate to a temperature between (1) a temperature at which at least a portion of the nano-ceramic material dissolves into the metal catalyst particle at the substrate interface and (2) the boiling point of the metal catalyst particle;
   (c) pumping at least a portion of the nano-ceramic material from the substrate into the metal catalyst particle until a nanostructure comprising the nano-ceramic material forms on a polar site of the metal catalyst particle, the polar site being substantially opposed to the substrate interface; and
   (d) cooling the metal catalyst particle containing the pumped nano-ceramic material and the nanostructure to an ambient temperature.

10. The process of claim 9 wherein step (b) further comprises heating the metal catalyst and the substrate in the presence of microwaves to a temperature at which at least a portion of the nano-ceramic material dissolves into the metal catalyst particle at the substrate interface.

11. The process of claim 9 where the pumping in step (c) comprises establishing a temperature drop across the metal catalyst particle from the substrate interface to the polar site.

12. The process of claim 9 where the pumping in step (c) comprises establishing a diffusion concentration gradient across the metal catalyst particle from the substrate interface to the polar site.

13. The process of claim 9 wherein step (a) comprises disposing a metal particle containing copper on the substrate.

14. The process of claim 9 wherein step (a) comprises disposing a metal particle containing nickel on the substrate.

15. The process of claim 9 wherein step (a) comprises disposing a metal particle containing a first row transition metal other than zinc on the substrate.

16. The process of claim 9 wherein step (a) comprises disposing a metal catalyst particle on a substrate comprising silica.

17. The process of claim 9 wherein step (a) comprises disposing a metal catalyst particle on a substrate comprising alumina.

18. The process of claim 9 wherein step (a) comprises disposing a metal catalyst particle on a substrate comprising titania.

19. A nanostructure produced by the process of claim 9.

* * * * *